United States Patent
Yu et al.

(10) Patent No.: US 10,269,752 B2
(45) Date of Patent: Apr. 23, 2019

(54) PACKAGE WITH UBM AND METHODS OF FORMING

(71) Applicant: Taiwan Semiconductor Manufacturing Company, Ltd., Hsin-Chu (TW)

(72) Inventors: Chen-Hua Yu, Hsin-Chu (TW);
Chien-Yu Li, Hsin-Chu (TW);
Hung-Jui Kuo, Hsin-Chu (TW);
Li-Hsien Huang, Puzi (TW);
Hsien-Wei Chen, Hsin-Chu (TW);
Der-Chyang Yeh, Hsin-Chu (TW);
Chung-Shi Liu, Hsin-Chu (TW);
Shin-Puu Jeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/605,848

(22) Filed: Jan. 26, 2015

(65) Prior Publication Data
US 2016/0079190 A1   Mar. 17, 2016

Related U.S. Application Data

(60) Provisional application No. 62/050,550, filed on Sep. 15, 2014.

(51) Int. Cl.
*H01L 21/56*     (2006.01)
*H01L 23/31*     (2006.01)
*H01L 23/00*     (2006.01)

(52) U.S. Cl.
CPC .............. *H01L 24/20* (2013.01); *H01L 24/19* (2013.01); *H01L 21/568* (2013.01);
(Continued)

(58) Field of Classification Search
CPC ....... H01L 2924/00; H01L 2224/73265; H01L 2224/48227; H01L 2224/73204; H01L 2224/0231; H01L 2224/0239
See application file for complete search history.

(56) References Cited

U.S. PATENT DOCUMENTS 6,489,229 B1 * 12/2002 Sheridan ................ H01L 24/03
  257/E21.508
7,465,654 B2 * 12/2008 Chou ................ H01L 23/53238
  257/E21.476

(Continued)

FOREIGN PATENT DOCUMENTS

CN     105428329 A     3/2016
JP     08181423 A      7/1996
(Continued)

*Primary Examiner* — Marc Anthony Armand
*Assistant Examiner* — Quinton A Brasfield
(74) *Attorney, Agent, or Firm* — Slater Matsil, LLP

(57) ABSTRACT

Package structures and methods of forming package structures are discussed. A package structure, in accordance with some embodiments, includes an integrated circuit die, an encapsulant at least laterally encapsulating the integrated circuit die, a redistribution structure on the integrated circuit die and the encapsulant, a connector support metallization coupled to the redistribution structure, and an external connector on the connector support metallization. The redistribution structure includes a dielectric layer disposed distally from the encapsulant and the integrated circuit die. The connector support metallization has a first portion on a surface of the dielectric layer and has a second portion extending in an opening through the dielectric layer. The first portion of the connector support metallization has a sloped sidewall extending in a direction away from the surface of the dielectric layer.

20 Claims, 6 Drawing Sheets

(52) U.S. Cl.
CPC ...... *H01L 23/3128* (2013.01); *H01L 2224/04105* (2013.01); *H01L 2224/12105* (2013.01); *H01L 2224/73267* (2013.01); *H01L 2224/92244* (2013.01); *H01L 2924/14* (2013.01)

(56) References Cited

U.S. PATENT DOCUMENTS

| | | | |
|---|---|---|---|
| 7,960,269 | B2 | 6/2011 | Lo et al. |
| 7,977,783 | B1 | 7/2011 | Park et al. |
| 7,989,954 | B2 | 8/2011 | Lin et al. |
| 8,884,433 | B2 | 11/2014 | Lin et al. |
| 8,912,087 | B2 * | 12/2014 | Hirtreiter ............ H01L 21/283 257/738 |
| 8,916,972 | B2 | 12/2014 | Lin et al. |
| 9,196,587 | B2 * | 11/2015 | Ying ............... H01L 23/5384 |
| 2003/0027430 | A1 * | 2/2003 | Stevens ............... B08B 3/04 438/754 |
| 2003/0166332 | A1 * | 9/2003 | Tong .................. H01L 24/11 257/E21.508 |
| 2004/0182915 | A1 | 9/2004 | Bachman et al. |
| 2005/0040527 | A1 * | 2/2005 | Huang ................ H01L 24/11 257/736 |
| 2007/0069346 | A1 * | 3/2007 | Lin ..................... H01L 24/11 257/673 |
| 2007/0164279 | A1 | 7/2007 | Lin et al. |
| 2007/0205520 | A1 | 9/2007 | Chou et al. |
| 2008/0042275 | A1 * | 2/2008 | Kuan .................. H01L 22/34 257/738 |
| 2008/0174003 | A1 | 7/2008 | Monthei et al. |
| 2009/0096098 | A1 * | 4/2009 | Yang ................ H01L 23/5389 257/738 |
| 2010/0072635 | A1 | 3/2010 | Kuo et al. |
| 2011/0068468 | A1 | 3/2011 | Lin et al. |
| 2011/0186987 | A1 * | 8/2011 | Wang ............... H01L 23/3171 257/737 |
| 2011/0198748 | A1 | 8/2011 | Koike |
| 2011/0241202 | A1 | 10/2011 | Liu et al. |
| 2012/0040524 | A1 * | 2/2012 | Kuo .................... H01L 24/11 438/614 |
| 2012/0299176 | A9 * | 11/2012 | Lin ................. H01L 23/49827 257/737 |
| 2013/0026618 | A1 * | 1/2013 | Chen ................. H01L 23/3192 257/737 |
| 2013/0087916 | A1 * | 4/2013 | Lin .................... H01L 24/19 257/738 |
| 2014/0210080 | A1 | 7/2014 | Chang et al. |
| 2014/0231125 | A1 | 8/2014 | Chen et al. |
| 2016/0079190 | A1 | 3/2016 | Yu et al. |

FOREIGN PATENT DOCUMENTS

| | | |
|---|---|---|
| TW | 200847352 A | 12/2008 |
| TW | 200917441 A | 4/2009 |
| TW | 201431036 A | 8/2014 |

* cited by examiner

PACKAGE WITH UBM AND METHODS OF FORMING

PRIORITY CLAIM AND CROSS-REFERENCE

This application claims priority to and the benefit of U.S. Provisional Application No. 62/050,550, filed on Sep. 15, 2014, entitled "UBM Metal Profile for Reliability Improvement," which application is hereby incorporated herein by reference in its entirety.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, such as individually or in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies may also require smaller packages that utilize less area than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
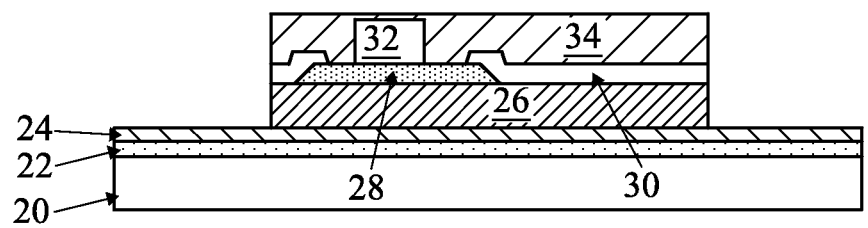
FIGS. 1 through 14 are cross-sectional views of intermediate steps during a process for forming a package structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package structure with a fan-out or fan-in wafer-level package. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the component may be sufficient to convey aspects of the embodiment. Further, method embodiments discussed herein may be discussed as being performed in a particular order; however, other method embodiments may be performed in any logical order.

FIGS. 1 through 14 illustrate cross-sectional views of intermediate steps during a process for forming a package structure in accordance with some embodiments. FIG. 1 illustrates a carrier substrate 20 and a release layer 22 formed on the carrier substrate 20. The carrier substrate 20 may be a glass carrier substrate, a ceramic carrier substrate, or the like. The carrier substrate 20 may be a wafer. The release layer 22 may be formed of a polymer-based material, which may be removed along with the carrier substrate 20 from the overlying structures that will be formed in subsequent steps. In some embodiments, the release layer 22 is an epoxy-based thermal-release material, which loses its adhesive property when heated, such as a Light-to-Heat-Conversion (LTHC) release coating. In other embodiments, the release layer 22 may be an ultra-violet (UV) glue, which loses its adhesive property when exposed to UV lights. The release layer 22 may be dispensed as a liquid and cured, may be a laminate film laminated onto the carrier substrate 20, or may be the like. An adhesive 24 can be formed or dispensed on the release layer 22. The adhesive 24 can be a die attach film (DAF), a glue, a polymer material, or the like.

Integrated circuit die 26 is adhered to the carrier substrate 20 (e.g., through the release layer 22) by the adhesive 24. As illustrated, one integrated circuit die 26 is adhered, and in other embodiments, more integrated circuit dies may be adhered. Before being adhered to the carrier substrate 20, the integrated circuit die 26 may be processed according to applicable manufacturing processes to form an integrated circuit in the integrated circuit die 26. For example, the integrated circuit die 26 comprises a bulk semiconductor substrate, a semiconductor-on-insulator (SOI) substrate, multi-layered or gradient substrates, or the like. The semiconductor of the substrate may include any semiconductor material, such as elemental semiconductor like silicon, germanium, or the like; a compound or alloy semiconductor including SiC, GaAs, GaP, InP, InAs, indium antimonide, SiGe, GaAsP, AlInAs, AlGaAs, GaInAs, GaInP, and/or GaInAsP; the like; or combinations thereof. Devices, such as transistors, diodes, capacitors, resistors, etc., may be formed in and/or on the semiconductor substrate and may be interconnected by interconnect structures formed by, for example, metallization patterns in one or more dielectric layers on the semiconductor substrate to form an integrated circuit.

The integrated circuit die 26 further comprises pads 28, such as aluminum pads, to which external connections are made. The pads 28 are on what may be referred to as an active side of the integrated circuit die 26. A passivation film 30 is on the integrated circuit die 26 and on portions of the pads 28. Openings are through the passivation film 30 to the pads 28. Die connectors 32, such as conductive pillars (for example, comprising a metal such as copper), are in the openings through passivation film 30 and are mechanically and electrically coupled to the respective pads 28. The die connectors 32 may be formed by, for example, plating or the like. The die connectors 32 electrically couple the integrated circuit of the integrate circuit die 26. One pad 28 and one die connector 32 are illustrated on the integrated circuit die 26 for clarity and simplicity, and one of ordinary skill in the art will readily understand that more than one pad 28 and more than one die connector 32 may be present.

A dielectric material 34 is on the active side of the integrated circuit die 26, such as on the passivation film 30 and the die connectors 32. The dielectric material 34 laterally encapsulates the die connectors 32, and the dielectric material 34 is laterally co-terminus with the integrated circuit die 26. The dielectric material 34 may be a polymer, such as polybenzoxazole (PBO), polyimide, benzocyclobutene (BCB), or the like. In other embodiments, the dielectric material 34 is formed of a nitride such as silicon nitride; an oxide such as silicon oxide, PhosphoSilicate Glass (PSG), BoroSilicate Glass (BSG), Boron-doped PhosphoSilicate Glass (BPSG), or the like; or the like. The dielectric material 34 may be formed by any acceptable deposition process, such as spin coating, chemical vapor deposition (CVD), laminating, the like, or a combination thereof. The integrated circuit die 26 may be singulated, such as by sawing or dicing, and adhered to the carrier substrate 20 by the adhesive 24 using, for example, a pick-and-place tool.

Figure 2:
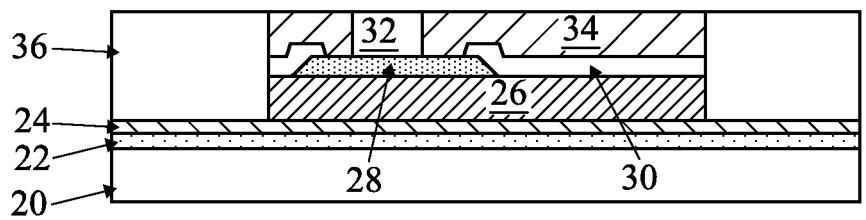

In FIG. 2, an encapsulant 36 is formed on the adhesive 24 around the integrated circuit die 26 and/or on the various components on the integrated circuit die 26. The encapsulant 36 may be a molding compound, epoxy, or the like, and may be applied by compression molding, transfer molding, or the like. After curing, the encapsulant 36 can undergo a grinding process to expose the die connectors 32. Top surfaces of the die connectors 32, dielectric material 34, and encapsulant 36 are co-planar after the grinding process. In some embodiments, the grinding may be omitted, for example, if the die connectors 32 are already exposed.

Figure 3:
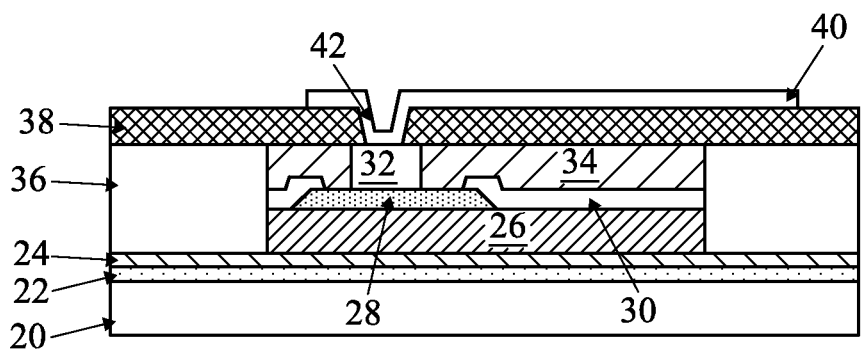
Figure 15:
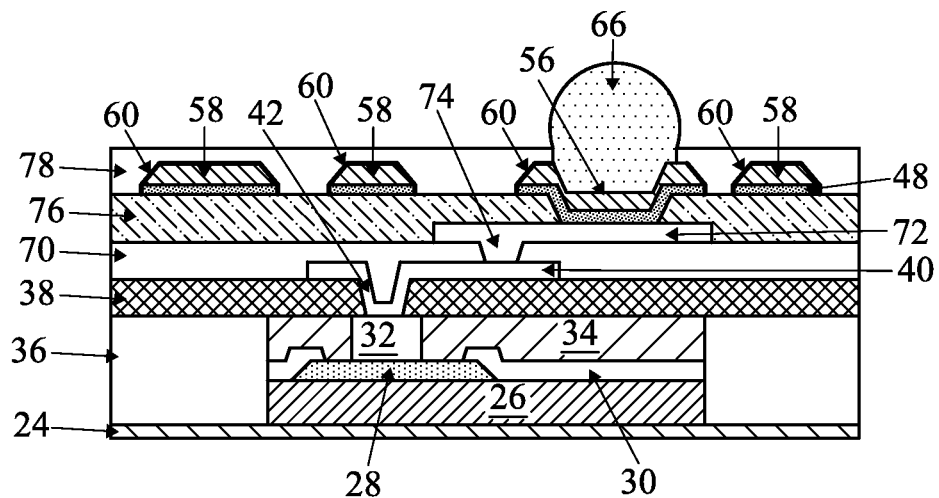
FIG. 15 is a cross-sectional view of a package structure in accordance with some embodiments.
Figure 16:
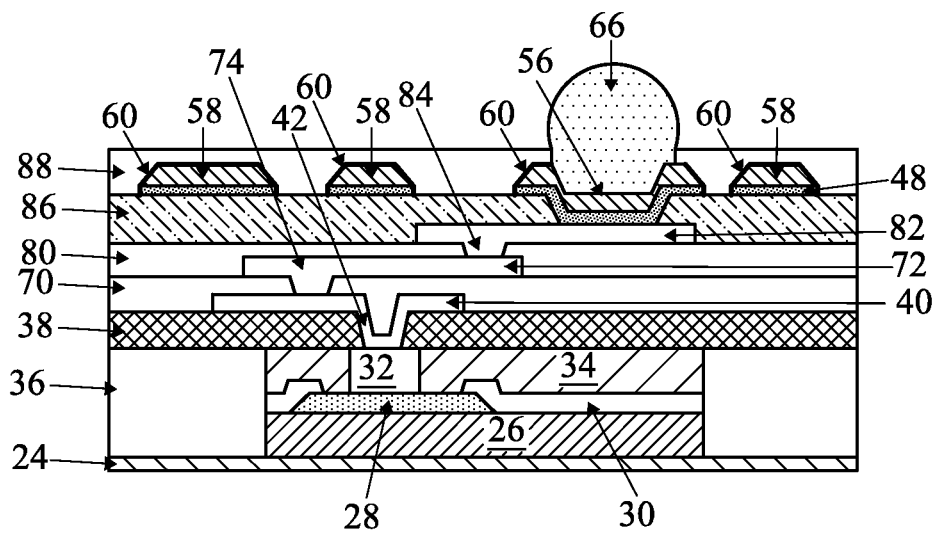
FIG. 16 is a cross-sectional view of a package structure in accordance with some embodiments.

In FIG. 3, a first dielectric layer 38 and first metallization pattern 40 of a redistribution structure are formed. FIG. 3 and figures that follow illustrate an example configuration of the redistribution structure, and in other embodiments, the redistribution structure can comprise any number of dielectric layers, metallization patterns, and vias, such as shown in FIGS. 15 and 16.

The first dielectric layer 38 is formed on the encapsulant 36, the dielectric material 34, and the die connectors 32. In some embodiments, the first dielectric layer 38 is formed of a polymer, which may be a photo-sensitive material such as PBO, polyimide, BCB, or the like, that may be easily patterned using a lithography mask. In other embodiments, the first dielectric layer 38 is formed of a nitride such as silicon nitride; an oxide such as silicon oxide, PSG, BSG, BPSG; or the like. The first dielectric layer 38 may be formed by spin coating, lamination, CVD, the like, or a combination thereof. The first dielectric layer 38 is then patterned to form openings to expose portions of the die connectors 32. The patterning may be by an acceptable process, such as by exposing the first dielectric layer 38 to light when the dielectric layer is a photo-sensitive material or by etching using, for example, an anisotropic etch.

The first metallization pattern 40 with vias 42 is formed on the first dielectric layer 38. As an example to form the first metallization pattern 40 and vias 42, a seed layer (not shown) is formed over the first dielectric layer 38. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, Physical Vapor Deposition (PVD) or the like. A photo resist is then formed and patterned on the seed layer. The photo resist may be formed by spin coating or the like and may be exposed to light for patterning. The pattern of the photo resist corresponds to the first metallization pattern 40. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the first metallization pattern 40 and vias 42. The vias 42 are formed in openings through the underlying layer, e.g., the first dielectric layer 38.

One or more additional metallization patterns with vias and dielectric layers may be formed in the redistribution structure by repeating the processes for forming the first dielectric layer 38 and the first metallization pattern 40. The vias may be formed during the formation of a metallization pattern as discussed. The vias may therefore interconnect and electrically couple the various metallization patterns. The depiction of one dielectric layer, e.g., the first dielectric layer 38, and one metallization pattern, e.g., the first metallization pattern 40, is for ease and simplicity of illustration.

Figure 4:
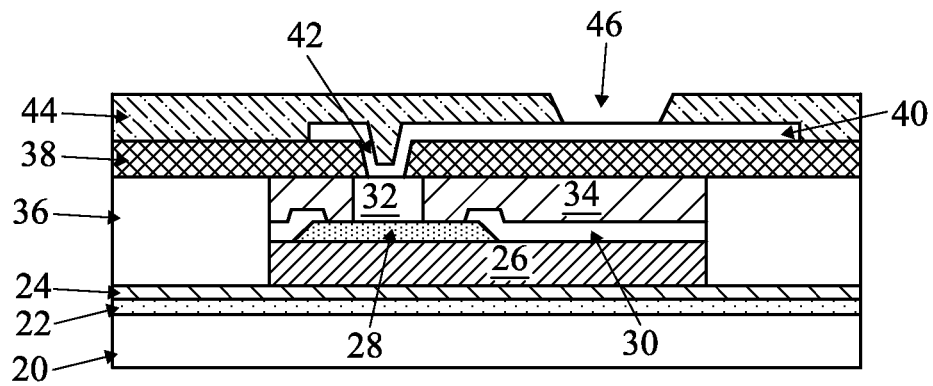

In FIG. 4, a second dielectric layer 44 is formed on the first metallization pattern 40 and the first dielectric layer 38. In some embodiments, the second dielectric layer 44 is formed of a polymer, which may be a photo-sensitive material such as PBO, polyimide, BCB, or the like, that may be easily patterned using a lithography mask. In other embodiments, the second dielectric layer 44 is formed of a nitride such as silicon nitride; an oxide such as silicon oxide, PSG, BSG, BPSG; or the like. The second dielectric layer 44 may be formed by spin coating, lamination, CVD, the like, or a combination thereof. The second dielectric layer 44 is then patterned to form openings 46 to expose portions of the first metallization pattern 40. The patterning may be by an acceptable process, such as by exposing the second dielectric layer 44 to light when the dielectric layer is a photosensitive material or by etching using, for example, an anisotropic etch.

Figure 5:
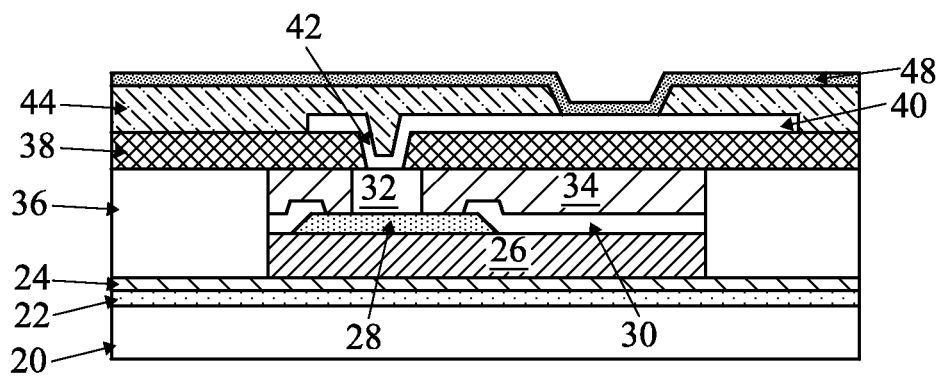

FIGS. 5 through 13 illustrate formation of Under Ball Metallizations (UBMs) 56 and external electrical connectors 66 on respective ones of the UBMs 56. In FIG. 5, a seed layer 48 is formed over the second dielectric layer 44 and in the opening 46, e.g., on sidewalls of the second dielectric layer 44 and on the first metallization pattern 40. In some embodiments, the seed layer 48 is a metal layer, which may be a single layer or a composite layer comprising a plurality of sub-layers formed of different materials. In some embodiments, the seed layer 48 comprises a titanium layer and a copper layer over the titanium layer. The seed layer 48 may be formed using, for example, PVD or the like.

Figure 6:
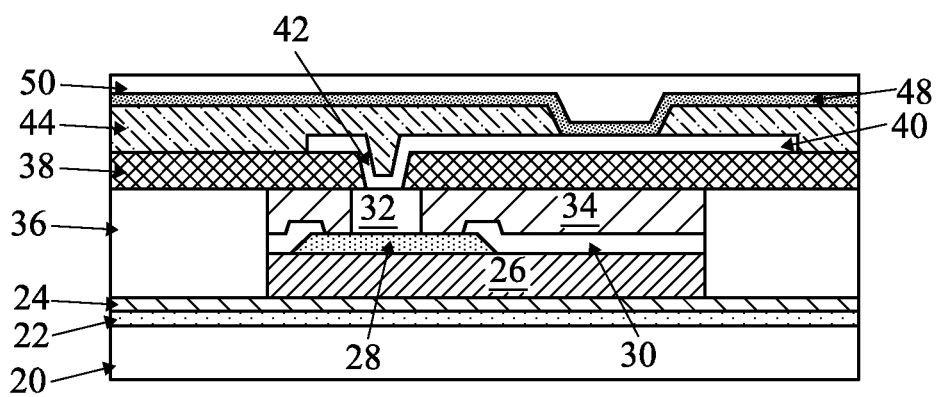

In FIG. 6, a photo resist 50 is then formed on the seed layer 48. In this embodiment, the photo resist 50 is a negative tone photo resist material. The photo resist 50 may be formed on the seed layer by spin coating or the like.

Figure 7:
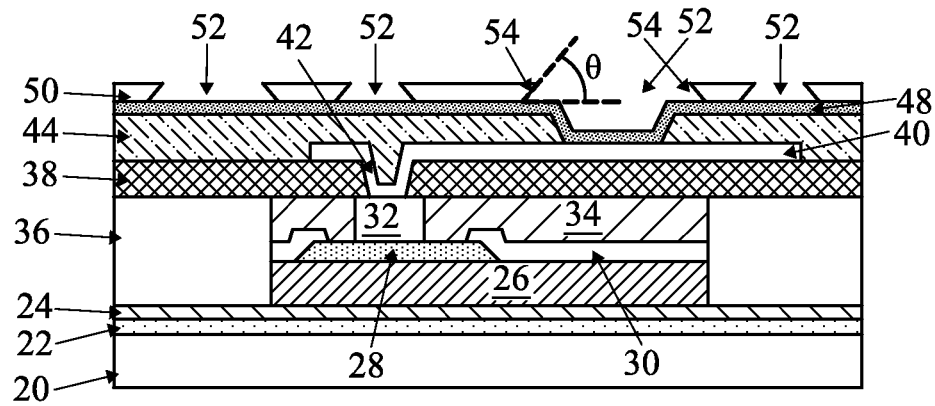

In FIG. 7, the photo resist 50 is patterned on the seed layer 48. The photo resist 50 may be exposed to light and subsequently developed for patterning. Using a negative tone photo resist, portions of the photo resist 50 that are exposed to the light remain after the patterning. After the exposure to light, the photo resist 50 is developed to remove soluble portions of the photo resist 50 such that the non-soluble portions of the photo resist 50 remain on the seed layer 48 with openings 52 through the photo resist 50. The openings 52 can have sloped sidewalls 54, e.g., sidewalls that are not perpendicular to a major surface underlying the photo resist 50 such as of the seed layer 48 and/or the second dielectric layer 44. As depicted, the sloped sidewalls 54 slope inwardly toward the opening in a direction extending away from the underlying major surface. Respective angles $\theta$ of the sloped sidewalls 54 with the immediately underlying surface in the openings 52 are less than 90°, such as between about 60° and about 85°. The pattern of the photo resist 50 corresponds to the UBMs 56 or other metallization patterns that will be formed.

Figure 8:
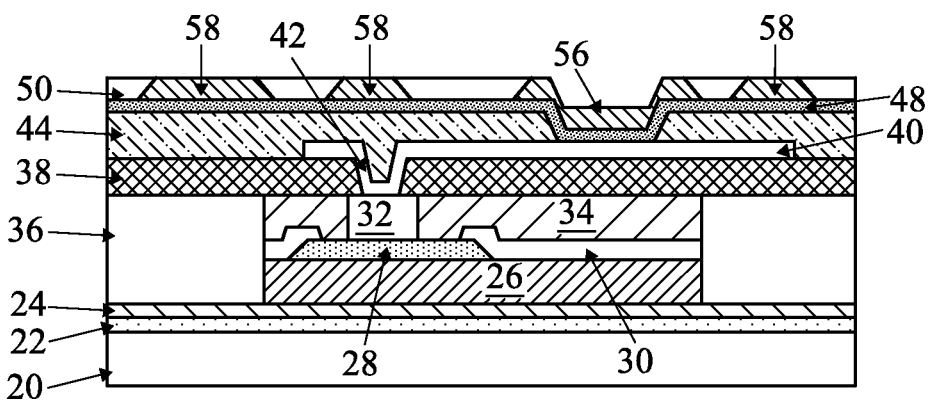

In FIG. 8, UBMs 56 and upper metallization pattern 58 are formed in respective openings 52 of the photo resist 50 and on the seed layer 48. A conductive material is formed in the openings 52 of the photo resist 50 and on the exposed portions of the seed layer 48, such as by plating, such as electroplating or electroless plating, or the like. The conductive material may comprise a metal, like copper, titanium, tungsten, aluminum, or the like. The UBMs 56 and upper metallization pattern 58 can also have sloped sidewalls that correspond to the sloped sidewalls 54 of the photo resist 50. Hence, angles formed by the sidewalls of the UBMs 56 and upper metallization pattern 58 with the underlying major surface may be less than 90°, such as between about 60° and about 85°.

Figure 9:
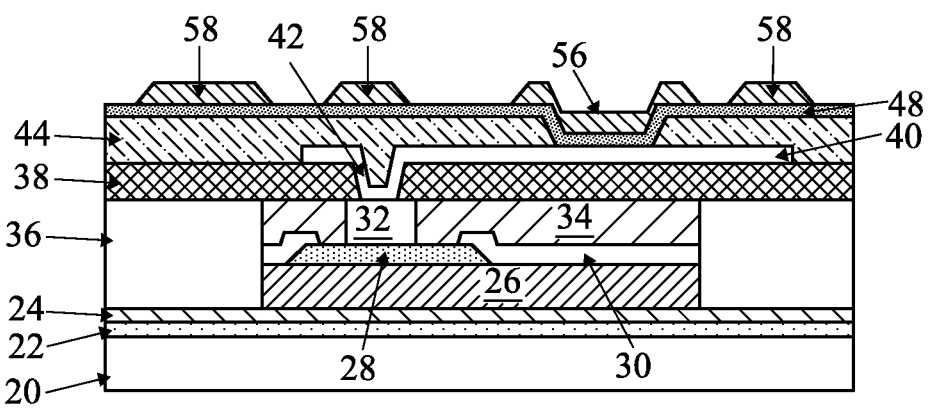
Figure 10:
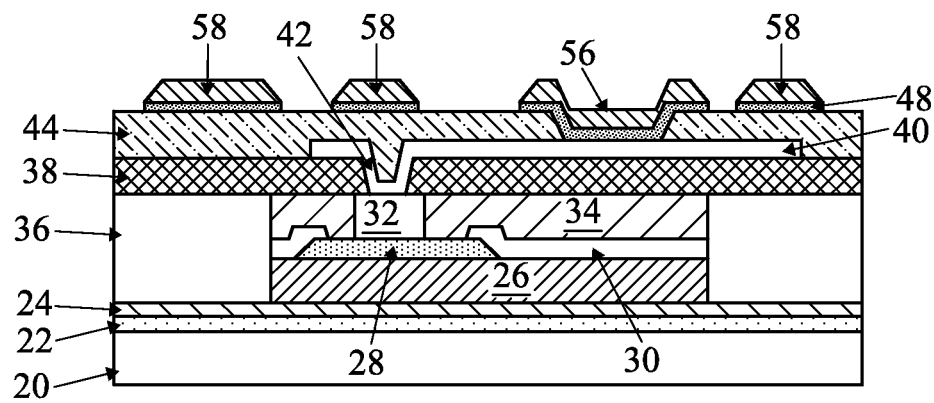

Then, in FIG. 9, the photo resist 50 is removed. The photo resist may be removed by an acceptable ashing or stripping process, such as using an oxygen plasma or the like. In FIG. 10, portions of the seed layer 48 on which the conductive material is not formed are removed. The exposed portions of the seed layer 48 are removed, for example, by using an acceptable etching process, such as by wet or dry etching. The remaining portions of the seed layer 48 and conductive material form the UBMs 56 and upper metallization pattern 58. As depicted the UBMs 56, with their corresponding portions of the seed layer 48, are formed in the openings 46 through the second dielectric layer 44 and are on the first metallization pattern 40. Hence, the UBMs 56 can be electrically coupled to the first metallization pattern 40.

Figure 11:
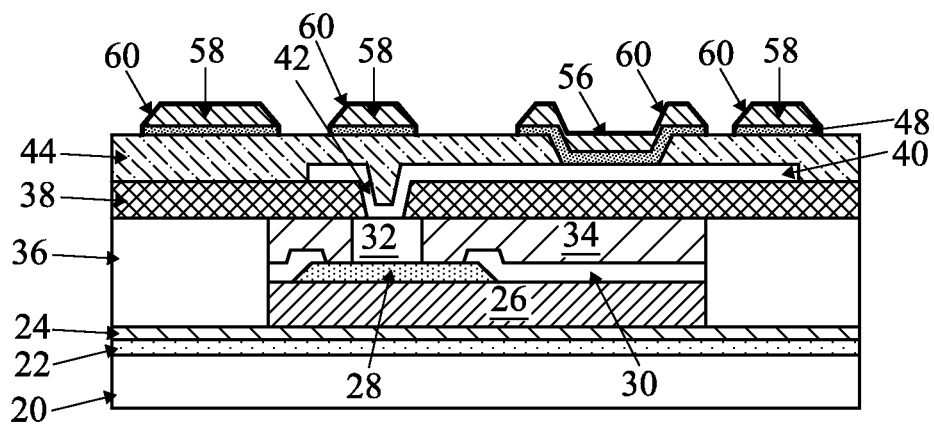

In FIG. 11, an adhesion layer 60 is formed on exterior surfaces of the UBMs 56 and upper metallization pattern 58. The adhesion layer 60 can be an oxide. For example, when the UBMs 56 and upper metallization pattern 58 comprise copper, the adhesion layer 60 can comprise copper oxide. The adhesion layer 60 can be formed by using an acceptable treatment, such as an oxidation treatment or the like. In some embodiments, the surfaces of the UBMs 56 and upper metallization pattern 58 can be exposed to a plasma containing an oxygen species, for example, an oxygen ($O_2$) plasma, an ozone ($O_3$) plasma, a combination of an inert gas and an oxygen-containing gas such as a combination of nitrogen ($N_2$) and oxygen ($O_2$), or the like. Other treatments may be used, and other adhesion layers may be formed.

Figure 12:
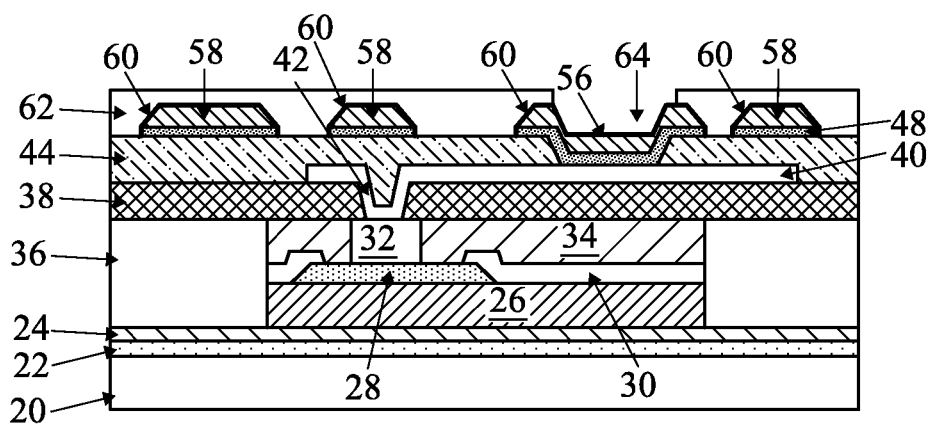

In FIG. 12, a third dielectric layer 62 is formed on the UBMs 56, upper metallization pattern 58, and the second dielectric layer 44. In some embodiments, the third dielectric layer 62 is formed of a polymer, which may be a photosensitive material such as PBO, polyimide, BCB, or the like, that may be easily patterned using a lithography mask. In other embodiments, the third dielectric layer 62 is formed of a nitride such as silicon nitride; an oxide such as silicon oxide, PSG, BSG, BPSG; or the like. The third dielectric layer 62 may be formed by spin coating, lamination, CVD, the like, or a combination thereof. The third dielectric layer 62 is then patterned to form openings 64 to expose portions of the UBMs 56 and/or of the adhesion layer 60 on the UBMs 56. The patterning may be by an acceptable process, such as by exposing the third dielectric layer 62 to light when the dielectric layer is a photo-sensitive material or by etching using, for example, an anisotropic etch.

Figure 13:
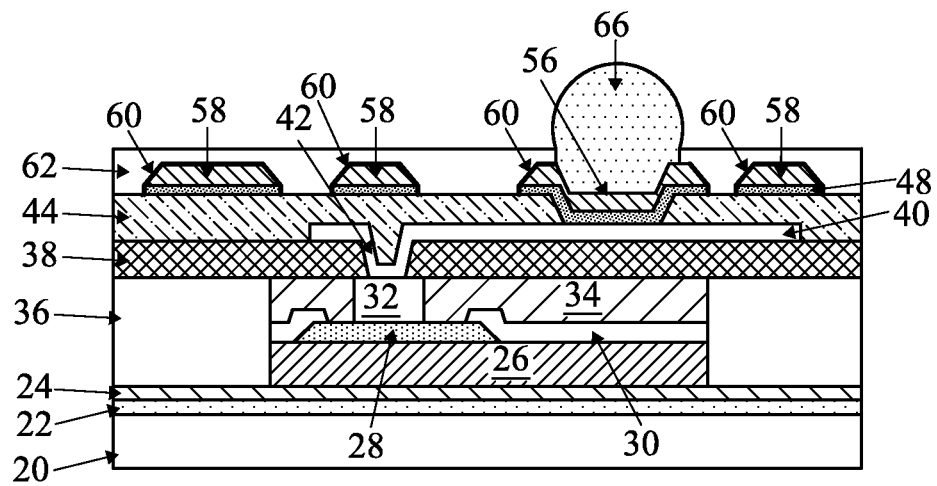

In FIG. 13, portions of the adhesion layer 60 exposed through openings 64 are removed, and external electrical connectors 66 are formed on the UBMs 56 through the openings 64. In some embodiments, the exposed portions of the adhesion layer 60 are removed when the external electrical connectors 66 are formed, for example, by a flux during a ball mount process. In some embodiments, the external electrical connectors 66 can include low-temperature reflowable material, such as solder, such as a lead-free solder, formed on the UBMs 56 using an acceptable ball drop process. In some embodiments, the external electrical connectors 66 are ball grid array (BGA) balls, controlled collapse chip connection (C4) bumps, microbumps, or the like. In additional embodiments, the external electrical connectors 66 can include metal pillars.

Figure 14:
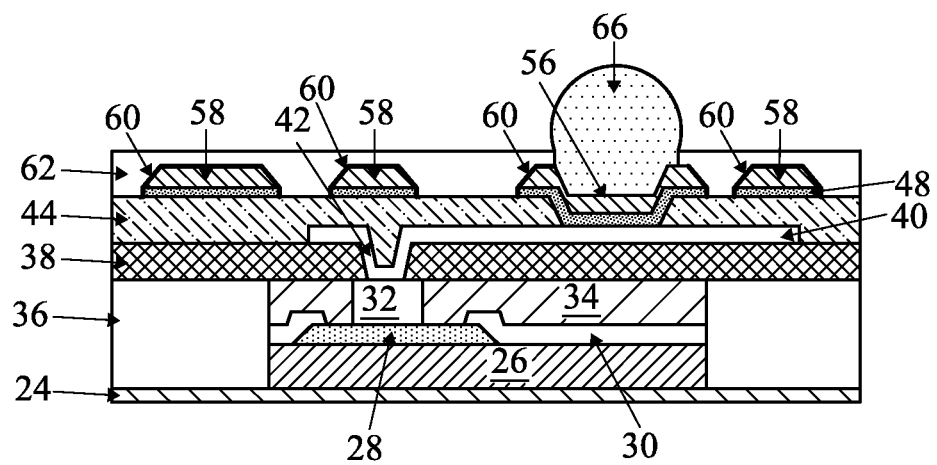

In FIG. 14, a carrier substrate de-bonding is performed to detach (de-bond) carrier substrate 20 from the package structure. In accordance with some embodiments, the de-bonding includes projecting a light such as a laser light or an UV light on release layer 22 so that release layer 22 decomposes under the heat of the light and carrier substrate 20 can be removed.

Although not depicted, the structure can then be flipped over and placed on a tape and singulated. One of ordinary skill in the art will understand that many such package structures may be simultaneously formed on the carrier substrate 20, and hence, individual packages, such as depicted in FIG. 14, can be singulated from the other packages, such as by sawing or dicing.

FIG. 15 illustrates another cross-sectional view of a package structure in accordance with some embodiments. In the embodiment depicted in FIG. 15, the redistribution structure comprises an additional dielectric layer and metallization pattern. To form this package structure, a process may proceed through the steps discussed above with respect to FIGS. 1 through 3. Then, a second dielectric layer 70 can be formed on the first dielectric layer 38 and first metallization pattern 40. The second dielectric layer 70 can be a same or similar material and can be formed in a same or similar manner as described above with respect to the first dielectric layer 38. The second dielectric layer 70 is then patterned to form openings to expose portions of the first metallization pattern 40, such as in a same or similar manner as discussed above with respect to the first dielectric layer 38. A second metallization pattern 72 with vias 74 is formed on the second dielectric layer 70 and in the openings through the second dielectric layer 70, such as with a same or similar material and in a same or similar manner as described above with respect to the first metallization pattern 40 and vias 42. The vias 74 electrically couple the first metallization pattern 40 to the second metallization pattern 72. The process may then proceed as discussed above with respect to FIGS. 4 through 14, where the second dielectric layer 44 and the third dielectric layer 62 correspond to a third dielectric layer 76 and a fourth dielectric layer 78, respectively, in FIG. 15.

FIG. 16 illustrates a further cross-sectional view of a package structure in accordance with some embodiments. In the embodiment depicted in FIG. 16, the redistribution structure comprises additional dielectric layers and metallization patterns. To form this package structure, a process may proceed through the steps discussed above with respect to FIGS. 1 through 3. Then, a second dielectric layer 70 can be formed on the first dielectric layer 38 and first metallization pattern 40. The second dielectric layer 70 can be a same or similar material and can be formed in a same or similar manner as described above with respect to the first dielectric layer 38. The second dielectric layer 70 is then patterned to form openings to expose portions of the first metallization pattern 40, such as in a same or similar manner as discussed above with respect to the first dielectric layer 38. A second metallization pattern 72 with vias 74 is formed on the second dielectric layer 70 and in the openings through the second dielectric layer 70, such as with a same or similar material and in a same or similar manner as described above with respect to the first metallization pattern 40 and vias 42. The vias 74 electrically couple the first metallization pattern 40 to the second metallization pattern 72.

Then, a third dielectric layer 80 can be formed on the second dielectric layer 70 and second metallization pattern 72. The third dielectric layer 80 can be a same or similar material and can be formed in a same or similar manner as described above with respect to the first dielectric layer 38. The third dielectric layer 80 is then patterned to form openings to expose portions of the second metallization pattern 72, such as in a same or similar manner as discussed above with respect to the first dielectric layer 38. A third metallization pattern 82 with vias 84 is formed on the third dielectric layer 80 and in the openings through the third dielectric layer 80, such as with a same or similar material and in a same or similar manner as described above with respect to the first metallization pattern 40 and vias 42. The vias 84 electrically couple the second metallization pattern 72 to the third metallization pattern 82. The process may then proceed as discussed above with respect to FIGS. 4 through 14, where the second dielectric layer 44 and the third dielectric layer 62 correspond to a fourth dielectric layer 86 and a fifth dielectric layer 88, respectively, in FIG. 16.

Embodiments can achieve advantages. By forming an adhesion layer 60 on the UBMs 56 and upper metallization pattern 58, the third dielectric layer 62 may have increased adhesion to the UBMs 56 and upper metallization pattern 58, which may in turn reduce delamination of the third dielectric layer 62. Further, by having sloped sidewalls of the UBMs 56 and upper metallization pattern 58, more surface area may be available to which the third dielectric layer 62 may adhere, which may further reduce delamination. Also, the sloped sidewalls of the UBMs 56 may reduce a hump or other build-up of the third dielectric layer 62 on the UBMs 56, such as when the third dielectric layer 62 is PBO or another polymer layer. This may improve uniformity of the third dielectric layer 62, which may improve reliability of the package.

A first embodiment is a package structure. The package structure comprises an integrated circuit die, an encapsulant at least laterally encapsulating the integrated circuit die, a redistribution structure on the integrated circuit die and the encapsulant, a connector support metallization coupled to the redistribution structure, and an external connector on the connector support metallization. The redistribution structure comprises a first dielectric layer disposed distally from the encapsulant and the integrated circuit die. The connector support metallization has a first portion on a first surface of the first dielectric layer and has a second portion extending in an opening through the first dielectric layer. The first portion of the connector support metallization has a sloped sidewall extending in a direction away from the first surface of the first dielectric layer.

Another embodiment is a package structure. The package structure comprises a composite structure, a redistribution structure on the composite structure, and an under ball metallization (UBM) on the redistribution structure. The composite structure comprises an integrated circuit die and an encapsulating material at least laterally encapsulating the integrated circuit die. A first surface of the redistribution structure is distal from the composite structure. The UBM has a first portion on the first surface. A sidewall of the first portion forms a non-perpendicular angle with the first surface, and the non-perpendicular angle is measured internal to the UBM. An adhesion layer is on the first portion of the UBM. A first dielectric layer is on the redistribution structure and adjoins the adhesion layer. An external electrical connector is disposed through the first dielectric layer and on the UBM.

A further embodiment is a method. The method comprises encapsulating an integrated circuit die with an encapsulant and forming a redistribution structure on the integrated circuit die and the encapsulant. The redistribution structure comprises a metallization pattern and a first dielectric layer on the metallization pattern. The first dielectric layer has a first surface distal from the integrated circuit die and the encapsulant. The method further comprises forming an under ball metallization (UBM) on the redistribution structure. The UBM has a first portion on the first surface and a second portion disposed in an opening through the first dielectric layer to the metallization pattern. The first portion of the UBM has a sidewall surface that is non-perpendicular to the first surface of the first dielectric layer. The method further comprises forming a second dielectric layer on the first surface of the first dielectric layer and the first portion of the UBM and forming an external electrical connector through an opening through the second dielectric layer to the UBM.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure comprising:
   an integrated circuit die;
   an encapsulant at least laterally encapsulating the integrated circuit die;
   a redistribution structure on the integrated circuit die and the encapsulant, the redistribution structure comprising a first dielectric layer disposed distally from the encapsulant and the integrated circuit die;
   a connector support metallization coupled to the redistribution structure, the connector support metallization having a first portion on a first surface of the first dielectric layer and having a second portion extending in an opening through the first dielectric layer, the first portion of the connector support metallization having a sloped sidewall outside of the opening and extending in a direction away from the first surface of the first dielectric layer, wherein the sloped sidewall has a first point located a first distance away from the integrated circuit die and a second point located a second distance away from the integrated circuit die, the second distance being larger than the first distance and wherein the first point is located further from a center of the opening than the second point;
   a seed layer located between the connector support metallization and the redistribution structure, wherein the seed layer has a second sidewall adjacent to the first sidewall, the second sidewall being perpendicular to the first surface; and
   an external connector on the connector support metallization, wherein each point of a surface of the connector support metallization is in physical contact with either a passivation layer or the external connector, the surface facing away from the integrated circuit die and extending from a first side of the connector support metallization to a second side of the connector support metallization opposite the first side.

2. The package of claim 1 further comprising:
   an adhesion layer on at least part of the first portion of the connector support metallization; and
   a second dielectric layer on the first dielectric layer and the adhesion layer, the external connector being disposed through an opening through the second dielectric layer.

3. The package structure of claim 2, wherein the connector support metallization comprises copper, and the adhesion layer is copper oxide.

4. The package structure of claim 2, wherein the external connector is directly coupled to the connector support metallization.

5. The package structure of claim 1, wherein an angle formed by the sloped sidewall and the first surface is in a range from 60 degrees to 85 degrees measured internally to the connector support metallization.

6. The package structure of claim 1, wherein the redistribution structure further comprises a metallization pattern, the first dielectric layer being on the metallization pattern, the connector support metallization being mechanically and electrically coupled to the metallization pattern.

7. A package structure comprising:
   a composite structure comprising an integrated circuit die and an encapsulating material at least laterally encapsulating the integrated circuit die;
   a redistribution structure on the composite structure, a first surface of the redistribution structure being a dielectric material and distal from the composite structure;
   an under ball metallization (UBM) on the redistribution structure and extending into an opening through the dielectric, the UBM having a first portion on the first surface, the first portion comprising a first sidewall located outside of the opening through the dielectric, the first sidewall facing away from the dielectric material and having a non-perpendicular angle with the first surface, the non-perpendicular angle being measured internal to the UBM;
   an adhesion layer on the first portion of the UBM;
   a seed layer located between the UBM and the redistribution structure, wherein the seed layer has a second sidewall adjacent to the first sidewall, the second sidewall being perpendicular to the first surface;
   a first dielectric layer on the redistribution structure and adjoining the adhesion layer; and
   an external electrical connector disposed through the first dielectric layer and on the UBM.

8. The package structure of claim 7, wherein the non-perpendicular angle is in a range from 60 degrees to 85 degrees.

9. The package structure of claim 7, wherein the external electrical connector directly couples the UBM.

10. The package structure of claim 7, wherein the external electrical connector is a solder ball.

11. The package structure of claim 7, wherein the redistribution structure comprises a metallization pattern and a second dielectric layer on the metallization pattern, the first surface of the redistribution structure being a surface of the second dielectric layer, the UBM further having a second portion disposed in an opening through the second dielectric layer to the metallization pattern.

12. The package structure of claim 7, wherein the UBM comprises copper, and the adhesion layer comprises copper oxide.

13. A package structure comprising:
   an encapsulant at least laterally encapsulating a semiconductor die;
   a first metallization layer in electrical connection with the semiconductor die and extending over the encapsulant;
   an underbump metallization in electrical connection with the first metallization layer, wherein the underbump metallization has a first sidewall that is diagonal to a major surface of the semiconductor die, wherein the first sidewall gets closer to a center of the underbump metallization as it moves further away from the semiconductor die, wherein the first sidewall is located over a portion of the encapsulant that is at least laterally encapsulating the semiconductor die;
   a seed layer located between the underbump metallization and the first metallization layer, wherein the seed layer has a second sidewall adjacent to the first sidewall, the second sidewall being perpendicular to the major surface;
   an external connector in physical contact with the underbump metallization; and
   a passivation layer, wherein the passivation layer covers each surface of the underbump metallization that is not covered by the external connector and not facing towards the semiconductor die.

14. The package structure of claim 13, further comprising a seed layer located between the underbump metallization and the first metallization layer.

15. The package structure of claim 13, further comprising a second metallization layer electrically connecting the first metallization layer to the underbump metallization, wherein the second metallization layer is located between the underbump metallization and the first metallization layer.

16. The package structure of claim 15, further comprising a third metallization layer electrically connecting the second metallization layer to the underbump metallization, wherein the third metallization layer is located between the underbump metallization and the second metallization layer.

17. The package structure of claim 13, wherein the first sidewall is at an angle of between about 60° and about 85°.

18. The package structure of claim 13, further comprising an adhesion layer located on an exterior surface of the underbump metallization.

19. The package structure of claim 18, further comprising a dielectric layer covering at least a portion of the adhesion layer.

20. The package structure of claim 13, further comprising a dielectric layer located between the encapsulant and the first metallization layer.

* * * * *